US008729627B2

(12) United States Patent
Cheng et al.

(10) Patent No.: US 8,729,627 B2
(45) Date of Patent: May 20, 2014

(54) STRAINED CHANNEL INTEGRATED CIRCUIT DEVICES

(75) Inventors: Ming-Lung Cheng, Qieding Township, Kaohsiung County (TW); Yen-Chun Lin, Hsinchu (TW); Da-Wen Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 334 days.

(21) Appl. No.: 12/780,124

(22) Filed: May 14, 2010

(65) Prior Publication Data

US 2011/0278676 A1 Nov. 17, 2011

(51) Int. Cl.
*H01L 29/94* (2006.01)

(52) U.S. Cl.
USPC ..... 257/330; 257/288; 257/369; 257/E29.255

(58) Field of Classification Search
USPC ......... 257/337, 343, 344, 347, 350, 394, 376, 257/329–333, 377, 382–385, 503, 335–336, 257/408
See application file for complete search history.

(56) References Cited

U.S. PATENT DOCUMENTS 6,706,571 B1 3/2004 Yu et al.
6,858,478 B2 2/2005 Chau et al.
7,132,322 B1 * 11/2006 Greene et al. ................. 438/199
7,190,050 B2 3/2007 King et al.
7,229,893 B2 * 6/2007 Wang et al. ................... 438/424
7,247,887 B2 7/2007 King et al.
7,265,008 B2 9/2007 King et al.
7,307,273 B2 * 12/2007 Currie ............................. 257/18
7,442,967 B2 * 10/2008 Ko et al. ....................... 257/192
7,508,031 B2 3/2009 Liu et al.
7,528,465 B2 5/2009 King et al.
7,605,449 B2 10/2009 Liu et al.
8,039,843 B2 * 10/2011 Inaba .............................. 257/64
8,264,021 B2 * 9/2012 Lai et al. ....................... 257/288
2004/0061191 A1 * 4/2004 Paton et al. ................... 257/412
2004/0075122 A1 * 4/2004 Lin et al. ....................... 257/288
2005/0153490 A1 7/2005 Yoon et al.

(Continued)

OTHER PUBLICATIONS

Sedky, et al., "Structural and Mechanical Properties of Polycrystalline Silicon Germanium for Micromachining Applications," IEEE Journal of Microelectromechanical Systems, vol. 7, No. 4, Dec. 1998, pp. 365-372.

(Continued)

*Primary Examiner* — Bilkis Jahan
(74) *Attorney, Agent, or Firm* — Haynes and Boone, LLP

(57) ABSTRACT

An apparatus includes a substrate having a strained channel region, a dielectric layer over the channel region, first and second conductive layers over the dielectric layer having a characteristic with a first value, and a strain-inducing conductive layer between the conductive layers having the characteristic with a second value different from the first value. A different aspect involves an apparatus that includes a substrate, first and second projections extending from the substrate, the first projection having a tensile-strained first channel region and the second projection having a compression-strained second channel region, and first and second gate structures engaging the first and second projections, respectively. The first gate structure includes a dielectric layer, first and second conductive layers over the dielectric layer, and a strain-inducing conductive layer between the conductive layers. The second gate structure includes a high-k dielectric layer adjacent the second channel region, and a metal layer.

19 Claims, 12 Drawing Sheets

(56) References Cited

U.S. PATENT DOCUMENTS

| | | | | |
|---|---|---|---|---|
| 2005/0245017 | A1* | 11/2005 | Belyansky et al. | 438/199 |
| 2006/0017098 | A1* | 1/2006 | Doczy et al. | 257/330 |
| 2007/0120156 | A1 | 5/2007 | Liu et al. | |
| 2007/0122953 | A1 | 5/2007 | Liu et al. | |
| 2007/0122954 | A1 | 5/2007 | Liu et al. | |
| 2007/0128782 | A1 | 6/2007 | Liu et al. | |
| 2007/0132053 | A1 | 6/2007 | King et al. | |
| 2007/0170472 | A1* | 7/2007 | Zhu | 257/288 |
| 2007/0228372 | A1 | 10/2007 | Yang et al. | |
| 2008/0258228 | A1 | 10/2008 | Chuang et al. | |
| 2008/0263492 | A1 | 10/2008 | Chuang et al. | |
| 2008/0290470 | A1 | 11/2008 | King et al. | |
| 2008/0296632 | A1 | 12/2008 | Moroz et al. | |
| 2009/0035909 | A1 | 2/2009 | Chang et al. | |
| 2009/0181477 | A1 | 7/2009 | King et al. | |
| 2009/0230427 | A1 | 9/2009 | Dyer et al. | |
| 2010/0006945 | A1 | 1/2010 | Merelle et al. | |
| 2010/0006974 | A1 | 1/2010 | Xu et al. | |
| 2010/0052059 | A1 | 3/2010 | Lee | |
| 2010/0109095 | A1* | 5/2010 | Li et al. | 257/392 |
| 2010/0183961 | A1 | 7/2010 | Shieh et al. | |
| 2010/0203734 | A1 | 8/2010 | Shieh et al. | |
| 2010/0264468 | A1 | 10/2010 | Xu | |

OTHER PUBLICATIONS

Ota, et al., "Novel Locally Strained Channel Technique for High Performance 55nm CMOS," IEEE, 2002, 4 pages.

Bartlomiej Jan Pawlak, et al., U.S. Appl. No. 12/569,689, "Method of Fabricating Finfet Device," filed Sep. 29, 2009, 21 pages.

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Appl. No. 12/756,552, "Hybrid Gate Process for Fabricating Finfet Device," filed Apr. 8, 2010, 38 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit for Finfet Devices," filed Jun. 30, 2010, 32 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12,780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12,840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (Finfet) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

* cited by examiner

STRAINED CHANNEL INTEGRATED CIRCUIT DEVICES

BACKGROUND

As the semiconductor industry has strived for higher device density, higher performance, and lower costs, problems involving both fabrication and design have been encountered. One solution to these problems has been the development of a fin-like field effect transistor (FinFET). A typical FinFET includes a thin vertical 'fin' formed by etching spaced recesses into a substrate. The source, drain, and channel regions are defined within this fin. The transistor's gate is wrapped around the channel region of the fin, engaging it on both the top of the fin and the sides of the fin. This configuration allows the gate to induce current flow in the channel from three sides. Thus, FinFET devices have the benefit of higher current flow and reduced short channel effects.

The dimensions of FinFETs and other metal oxide semiconductor field effect transistors (MOSFETs) have been progressively reduced as technological advances have been made in integrated circuit materials. However, this scaling-down trend has slowed due to physical limits of IC materials. Thus, other techniques to increase device performance have been devised. One such technique involves straining the channel region of MOSFET devices to improve electron and hole mobility. Results has been generally adequate, but the level of channel strain obtained thus far has been not entirely satisfactory.

Additionally, there has been a trend in the semiconductor industry to replace the traditional gate oxide and polysilicon gate electrode in FinFET devices with a high-k gate dielectric and metal gate electrode to improve device performance. For example, replacement gate techniques have been devised to fabricate CMOS devices with dual metal gate FinFET devices. However, high costs and burdensome complexity in the fabrication process have rendered dual metal gate devices less than entirely satisfactory.

SUMMARY

According to one of the broader forms of the invention, an apparatus includes a substrate having a strained channel region therein, a dielectric layer disposed at least partly over the channel region, a first conductive layer disposed over the dielectric layer, and having a characteristic with a first value, a strain-inducing conductive layer disposed over the first conductive layer, and having the characteristic with a second value, wherein the second value is different from the first value, and a second conductive layer disposed over the strain-inducing conductive layer, and having the characteristic with the first value.

According to another of the broader forms of the invention, an apparatus includes a substrate, first and second projections extending upwardly from the substrate, the first projection having a tensile-strained first channel region therein and the second projection having a compression-strained second channel region therein, and first and second gate structures engaging the first and second projections adjacent to the first and second channel regions, respectively. The first gate structure includes a dielectric layer adjacent the first channel region, a first conductive layer disposed over the dielectric layer, a strain-inducing conductive layer disposed over the first conductive layer, and a second conductive layer disposed over the strain-inducing conductive layer. The second gate structure includes a high-k dielectric layer adjacent the second channel region, and a metal layer disposed over the high-k dielectric layer.

According to yet another of the broader forms of the invention, a method includes providing a substrate, forming a projection extending upwardly from the substrate, the projection having a channel region therein, forming a gate structure engaging the projection adjacent to the channel region, the gate structure having spaced first and second conductive layers and a strain-inducing conductive layer disposed between the first and second conductive layers, forming a capping layer over the gate structure, imparting strain to the channel region, including performing a heat treatment on the gate structure, and removing the capping layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor devices and more particularly, to a FinFET device and method of fabricating a FinFET device or portion of a device. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact.

Figure 1:
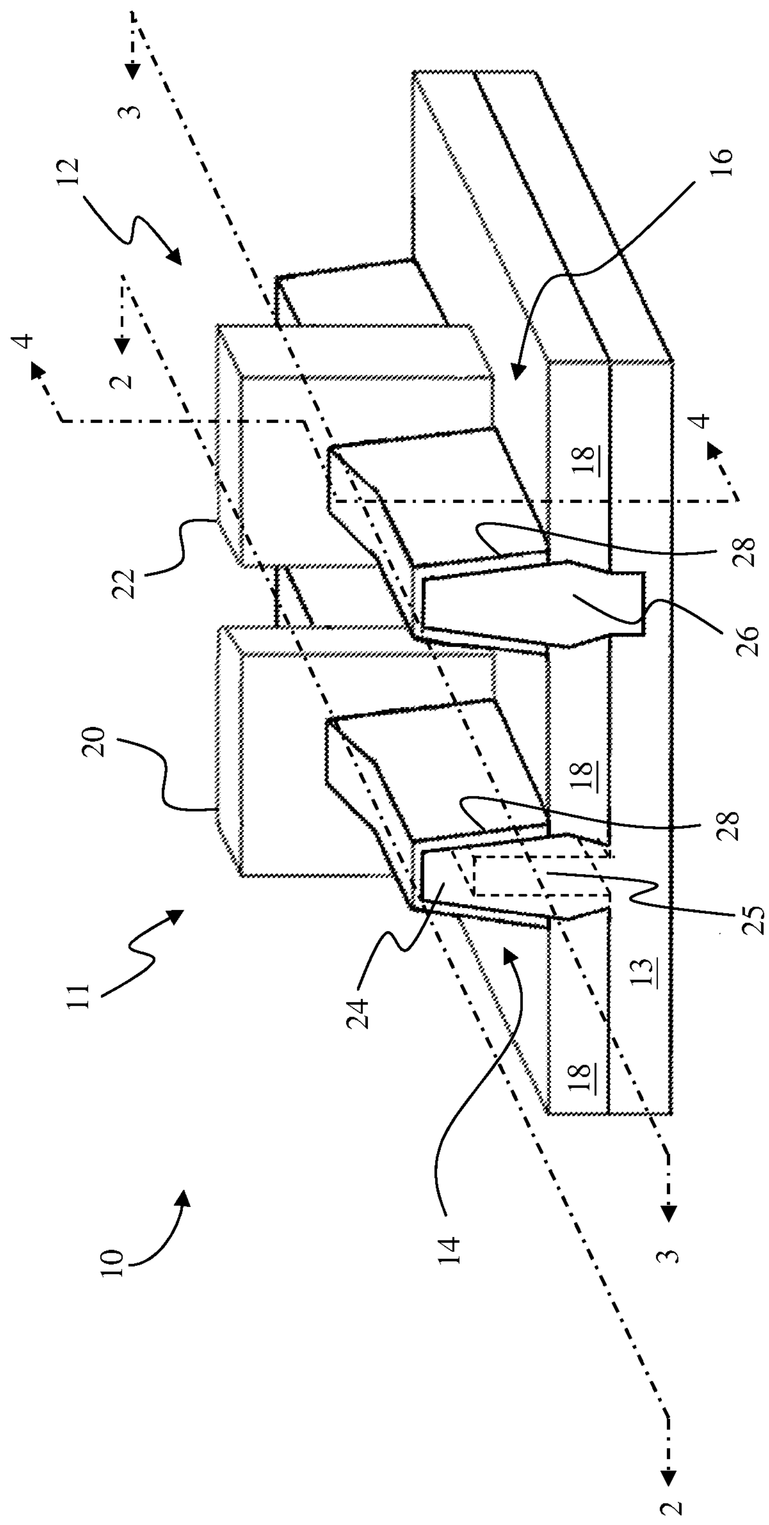
FIG. 1 is a diagrammatic fragmentary perspective view of a CMOS semiconductor device.

FIG. 1 is a diagrammatic fragmentary perspective view of a CMOS semiconductor device 10. The semiconductor device 10 is an integrated circuit that includes a fin-like n-channel metal-oxide-semiconductor field effect transistor (NMOS FinFET) 11 and a fin-like p-channel metal-oxidesemiconductor field effect transistor (PMOS FinFET) 12. NMOS FinFET 11 and PMOS FinFET 12 may alternatively be any type of fin-based transistor. The FinFETs 11 and 12 may be part of a microprocessor, memory cell (e.g., SRAM), and/or other integrated circuits.

The NMOS FinFET 11 and PMOS FinFET 12 are formed on silicon semiconductor substrate 13. The substrate 13 may alternatively include other elementary semiconductors such as germanium, or include a compound semiconductor such as silicon carbide, gallium arsenide, indium arsenide, and indium phosphide. Alternatively, the substrate 13 may be a silicon-on-insulator (SOI) substrate. In such a case, the SOI substrate may be fabricated using separation by implantation of oxygen (SIMOX), wafer bonding, and/or other suitable methods.

The semiconductor device 10 includes fin structures (or projections) 14 and 16 that extend upwardly from the substrate 13 and form portions of the NMOS FinFET 11 and PMOS FinFET 12, respectively. Shallow trench isolation (STI) regions 18 surround the bottom portions of the fin structures (or projections) 14 and 16 and prevent electrical interference or crosstalk. The STI regions 18 are composed of silicon oxide. Alternatively, they could be silicon nitride, silicon oxynitride, other suitable materials, and/or combinations thereof. It is understood that although two fin structures are illustrated, additional parallel fins may be formed from substrate 13 in a similar manner.

The semiconductor device 10 also includes gate structures 20 and 22 that overlay a central portion of the fin structures (or projections) 14 and 16, respectively. Gate structure 20 forms a part of NMOS FinFET 11 and gate structure 22 forms a part of PMOS FinFET 12. Further, gate structures 20 and 22 each include a plurality of layers which will be explained in more detail later. The gate structures 20 and 22 each engage three surfaces of respective fin structures (or projections) 14 and 16—the top surface and two adjacent side surfaces. The fin structure (or projection) 14 includes epitaxial silicon (Si) growths 24 on each side of the gate structure 20. The epitaxial Si growths 24 are formed on a substrate protrusion 25. The substrate protrusion 25 is part of and extends from the substrate 13 and forms the core of the fin structure (or projection) 14. The gate structure 20 engages the central portion of substrate protrusion 25 where the protrusion is free of the epitaxial Si growths 24. Fin structure (or projection) 16 includes epitaxial silicon germanium (SiGe) growths 26 on each side of the gate structure 22. Fin structure (or projection) 16 also includes a substrate protrusion (not visible in FIG. 1), but only beneath the gate structure 22 and between the epitaxial SiGe growths 26. Further, nickel silicide (NiSi) layers 28 are disposed over the portions of the epitaxial Si growths 24 and the epitaxial SiGe growths 26 that extend above the STI regions 18. Alternatively, the silicide layers may be other types of silicide, for example, titanium silicide. The fin structures (or projections) 14 and 16 and gate structures 20 and 22 of semiconductor device 10 are surrounded by an inter-level dielectric layer (ILD). But for the sake of clarity, semiconductor device 10 is depicted in FIG. 1 without this ILD.

Figures 2, 3:
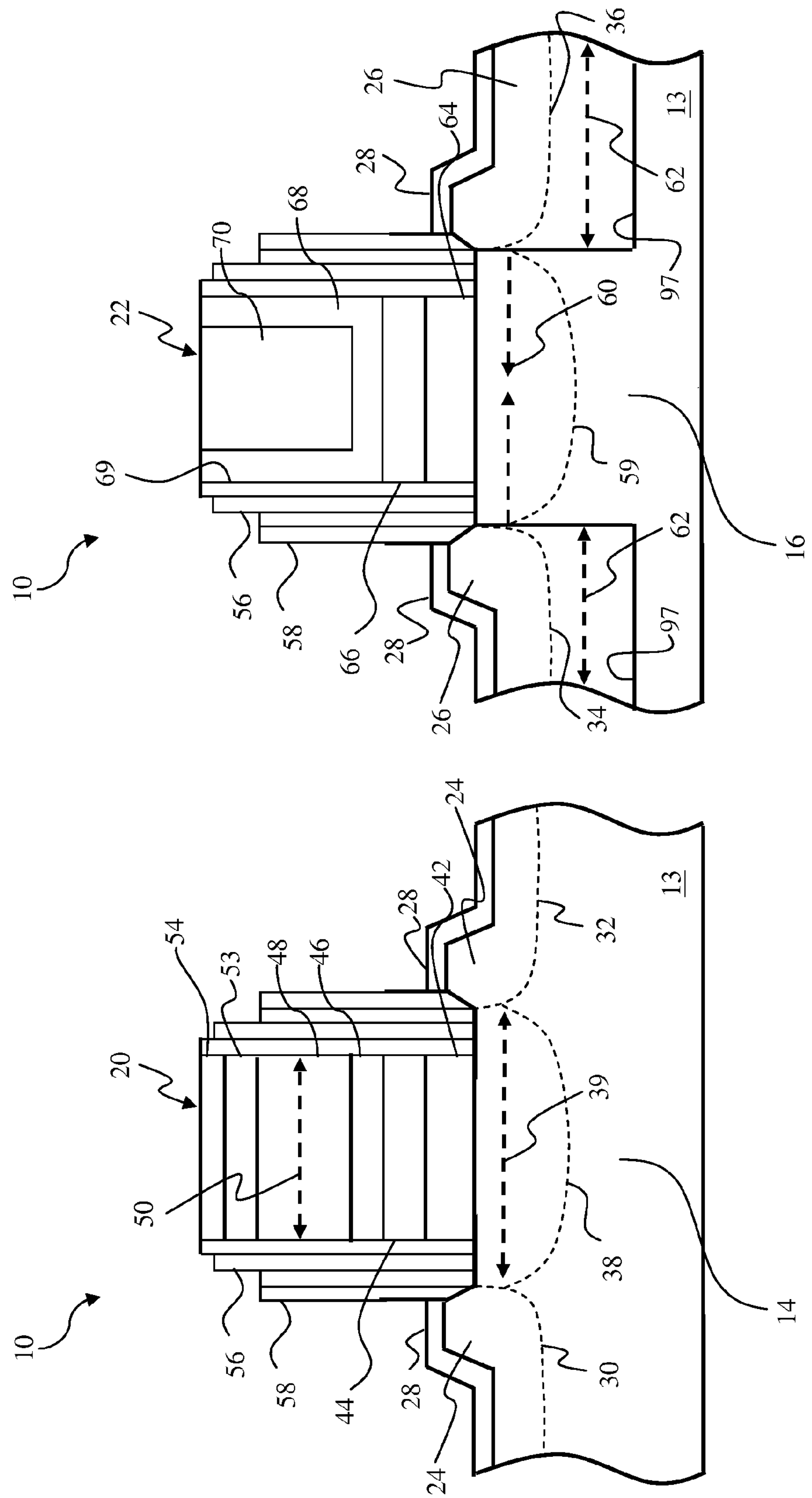
FIG. 2 is a diagrammatic fragmentary sectional view of the semiconductor device taken along line 2-2 in FIG. 1.
FIG. 3 is a diagrammatic fragmentary sectional view of the semiconductor device taken along line 3-3 in FIG. 1.
Figure 4:
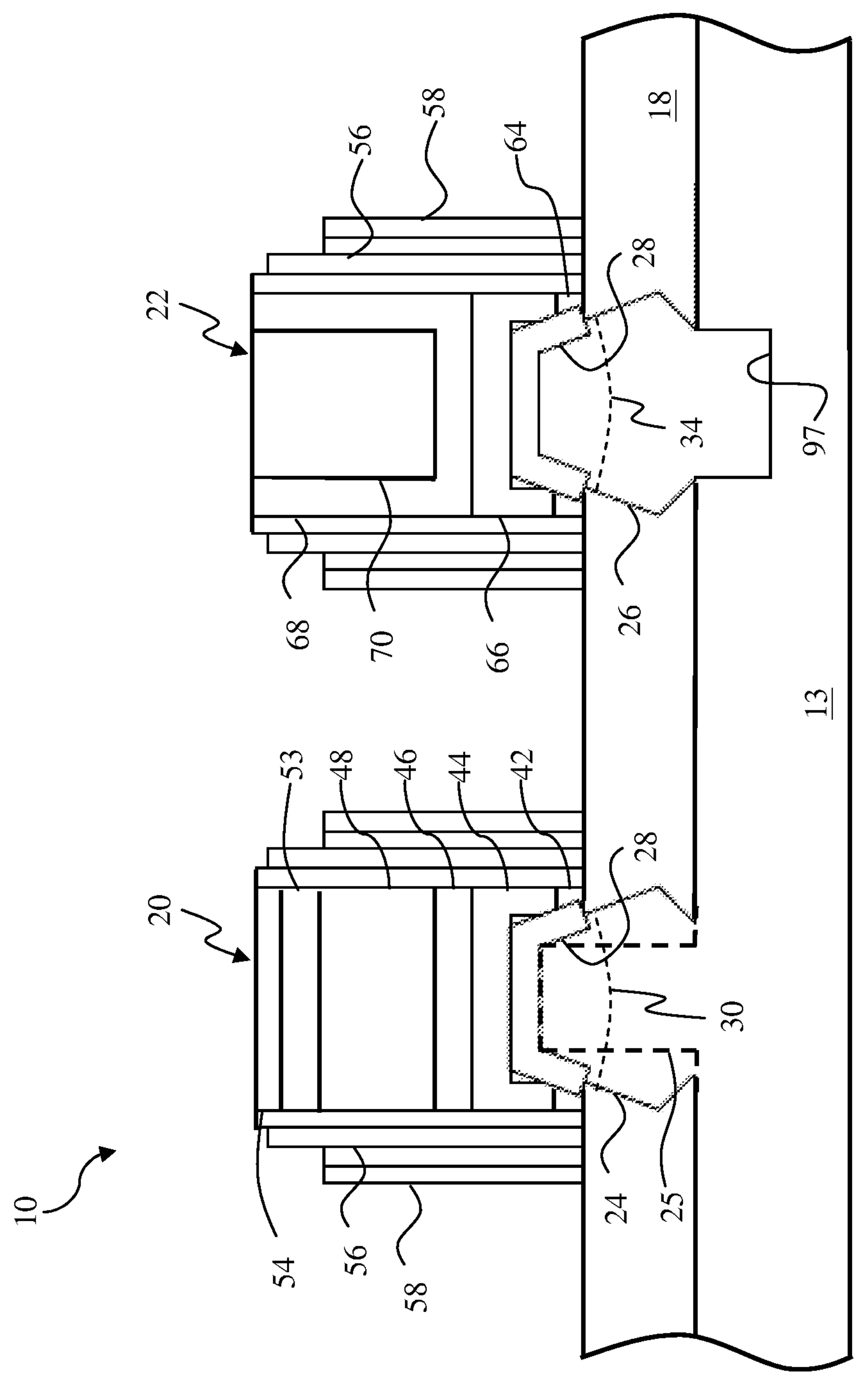
FIG. 4 is a diagrammatic fragmentary sectional view of the semiconductor device taken along line 4-4 in FIG. 1.

FIGS. 2-4 are diagrammatic fragmentary sectional views of the semiconductor device 10 taken along lines 2-2, 3-3, and 4-4 in FIG. 1, respectively. FIG. 2 depicts a cross-section of the fin structure (or projection) 14 and gate structure 20 that form portions of NMOS FinFET 11. FIG. 3 depicts a cross-section of the fin structure (or projection) 16 and gate structure 22 that form portions of PMOS FinFET 12. And due to the non-linear path of line 4-4, FIG. 4 illustrates cross-sections of both the epitaxial growth 24 and the gate structure 20 of FinFET 11, even though these cross-sections do not lie in the same plane.

With reference to FIGS. 1 and 2, the fin structure (or projection) 14 also includes a source region 30 and a drain region 32 that are respectively defined on opposite sides of gate structure 20. The source and drain regions 30 and 32 each include portions of the epitaxial Si growths 24 that extend above the STI regions 18, and portions of protrusion 25. These source and drain regions are doped regions having a dopant implanted therein that is appropriate for the design requirements of the FinFET 11. Here, because fin structure (or projection) 14 is part of an NMOS device, source and drain regions 30 and 32 are doped with an n-type dopant such as phosphorus or arsenic, or combinations thereof. With reference to FIGS. 1 and 3, fin structure (or projection) 16 includes a source region 34 and a drain region 36 that are respectively defined on opposite sides of gate structure 22. The source and drain regions 34 and 36 each include portions of the epitaxial SiGe growths 26 that extend above the STI regions 18. Fin structure (or projection) 16 is a portion of a PMOS device so source and drain regions 34 and 36 are doped with a p-type dopant such as boron or BF2 or combinations thereof.

With reference again to FIGS. 1 and 2, fin structure (or projection) 14 includes a strained channel region 38 defined in the portion of the fin structure (or projection) 14 surrounded on three sides by the gate structure 20. The channel region 38 is interposed between the source region 30 and the drain region 32 within the fin structure (or projection) 14. Further, the channel region 38 is tensile-strained. That is, the crystal lattice of the silicon in the channel region is stretched, resulting in higher electron mobility during operation of the NMOS FinFET 11. In FIG. 2, a dashed arrow 39 diagrammatically denotes the tensile strain imparted to channel region 38. A portion of this strain is induced by the epitaxial silicon growths 24 on either side of channel region 38. The epitaxial growths 24 have a lattice constant different than that of the silicon in the channel region 38. Alternatively, the epitaxial growths 24 may be epitaxial silicon carbon (Si:C) instead of epitaxial silicon.

As noted above, the gate structure 20 includes a plurality of layers that form the gate portion of the NMOS FinFET 11. In the lower-most portion of gate structure 20, a dielectric layer 42 engages fin structure (or projection) 14 on three sides. Here, the dielectric layer 42 is composed of a high-k dielectric material, such as hafnium oxide (HfOx). Alternatively, the dielectric layer 42 may include one or more other high-k dielectrics such as hafnium silicon oxide (HfSiO) or hafnium silicon oxynitride (HfSiON) or may be composed of a material with a standard dielectric constant, such as silicon oxide. The dielectric layer 42 has a thickness in a range from about 1 to about 200 angstrom (Å). Although the dielectric layer 42 is illustrated as a single layer in FIG. 2, it may optionally include additional layers such as an interfacial layer of silicon oxide between the silicon of fin structure (or projection) 14 and the remainder of the dielectric layer 42. A barrier layer 44 (also referred to as a capping layer, a diffusion layer, or an etch stop layer) is disposed above the dielectric layer 42. The barrier layer 44 is composed of titanium nitride (TiN) having a thickness in a range from about 5 to about 1000 Å. Alternatively, the barrier layer 44 may include TaN or other materials suitable to reduce or eliminate the risk of Fermi level pinning between the high-k material in dielectric layer 42 and adjacent polysilicon layers. A doped, conductive polysilicon layer 46 is disposed on the barrier layer 44. The polysilicon layer 46 has a thickness in a range of 50 to 200 Å.

The gate structure 20 further includes a conductive strain-inducing layer 48. The strain-inducing layer 48 includes material that has a thermal expansion coefficient larger than that of the polysilicon layer 46 below it. Further, the crystal lattice constant of the strain-inducing layer is different from that of the polysilicon layer 46, resulting in lattice mismatch. The differences in the thermal expansion coefficients and crystal lattice constants of strain-inducing layer 48 and polysilicon material are such that the channel region 38 below the gate structure 20 is tensile-strained after processing is complete. In the current embodiment, the strain-inducing layer 48 is composed of silicon germanium (SiGe) and has a thickness in a range of about 300 to 450 Å. In FIG. 2, a dashed arrow 50 diagrammatically denotes the strain-inducing characteristics of the SiGe layer 48.

The gate structure 20 includes a second doped, conductive polysilicon layer 53 disposed above the strain-inducing layer 48. The polysilicon layer 53 has a thickness of approximately 100 Å. A nickel silicide layer 54 is disposed on the second polysilicon layer 53 and is the upper-most layer of the gate structure 20. As noted above, other types of silicide material may be used instead. Semiconductor device 10 also includes sealing spacers 56 disposed on sidewalls of the gate structure 20. The sealing spacers 56 are formed of silicon oxide but may optionally contain silicon nitride as well or, alternatively, be composed of other suitable dielectric material. The FinFET 11 further includes dummy spacers 58 disposed on the sealing spacers 56. The dummy spacers 58 are each a multi-layer structure composed of both silicon nitride and silicon oxide, but alternatively they may be integral structures.

With reference to FIGS. 3 and 4, and as noted above, FIG. 3 depicts a cross-section of the fin structure (or projection) 16 and gate structure 22 that form portions of PMOS FinFET 12. And due to the non-linear path of line 4-4, FIG. 4 illustrates cross-sections of both the epitaxial growth 26 and the gate structure 22 of FinFET 12. Fin structure (or projection) 16 includes a strained channel region 59 defined in the portion of the fin structure (or projection) 16 surrounded on three sides by the gate structure 22. The channel region 59 is interposed between source region 34 and drain region 36 within the fin structure (or projection) 16. The channel region 59 is compression-strained. That is, the crystal lattice of the silicon in the channel region is compressed, resulting in greater hole mobility. Greater hole mobility in a PMOS transistor device lowers threshold voltage and increases efficiency. Dashed arrows 60 diagrammatically indicate the compressive strain in the channel region 59. As noted earlier in the description of FIG. 1, fin structure (or projection) 16 includes epitaxial SiGe growths 26. The epitaxial SiGe growths 26 have a larger crystal lattice constant than the nearby silicon of the fin structure (or projection) 16. Thus, the epitaxial SiGe growths 26 cause the crystal lattice of the channel region 59 disposed between the epitaxial SiGe growths 26 to be compressed, resulting in compressive channel strain. Dashed arrows 62 diagrammatically indicate the strain-inducing character of the epitaxial SiGe growths.

The gate structure 22 overlays the fin structure (or projection) 16 and is disposed above and on the sides of the strained channel region 59 defined therein. In the bottom portion of gate structure 22, a dielectric layer 64 composed of a high-k dielectric material engages the channel region 59. In the current embodiment, the dielectric layer 64 is composed of HfOx. Alternately, it could be formed of HfO2, HfSiO, HfSiON, HfTaO, HfTiO, HfZrO, AlO, ZrO, TiO, Ta2O5, Y2O3, SrTiO3 (STO), BaTiO3 (BTO), BaZrO, HfLaO, HfSiO, LaSiO, AlSiO, (Ba, Sr)TiO3 (BST), Al2O3, Si3N4, oxynitrides, other suitable high-k dielectric materials, and/or combinations thereof. Like dielectric layer 42 in gate structure 20, dielectric layer 64 may optionally include an interfacial layer of silicon oxide or other oxide material between the channel region and the remainder of dielectric layer 64. A barrier layer 66 is disposed on the dielectric layer 64 and is similar to the barrier layer 44.

A U-shaped work function metal layer 68 is formed over the barrier layer 66 in gate structure 22 and partially fills an opening 69. Because gate structure 22 is a portion of a PMOS device, the work function metal layer 68 is composed of a p-type work function metal (P-metal), such as titanium nitride (TiN). Alternatively, the work function layer may include other materials such as Ru, Mo, Al, WN, or combinations thereof. Further, the work function layer may alternatively be a multi-metal layer structure with a sufficiently high effective work function (EWF) value for proper PMOS device performance. For example, the work function layer may include both a TiN layer and a TaN layer. The gate structure 22 contains a metal fill layer 70 that fills the portion of the opening 69 not occupied by the work function layer 68. The metal fill layer 70 is composed of a conductive metal, specifically aluminum (Al). Alternatively, the metal fill layer may include copper, tungsten, titanium, other suitable materials, and/or combinations thereof. The FinFET 12 further includes, on sidewalls of the gate structure 22, sealer spacers 56 and dummy spacers 58 that are equivalent to the spacers 56 and 58 on gate structure 20.

FIGS. 5-12 are diagrammatic fragmentary sectional views similar to FIG. 4 but showing the semiconductor device 10 during various successive stages of manufacture. The stages of manufacture depicted in FIGS. 5-12 correspond with fabrication of the semiconductor device 10 using a CMOS technology process flow. It should be understood that additional processes may be provided before, during, and/or after the stages illustrated in FIGS. 5-12, and that some selected processes may only be briefly described if they are well known in the art.

Figure 5:
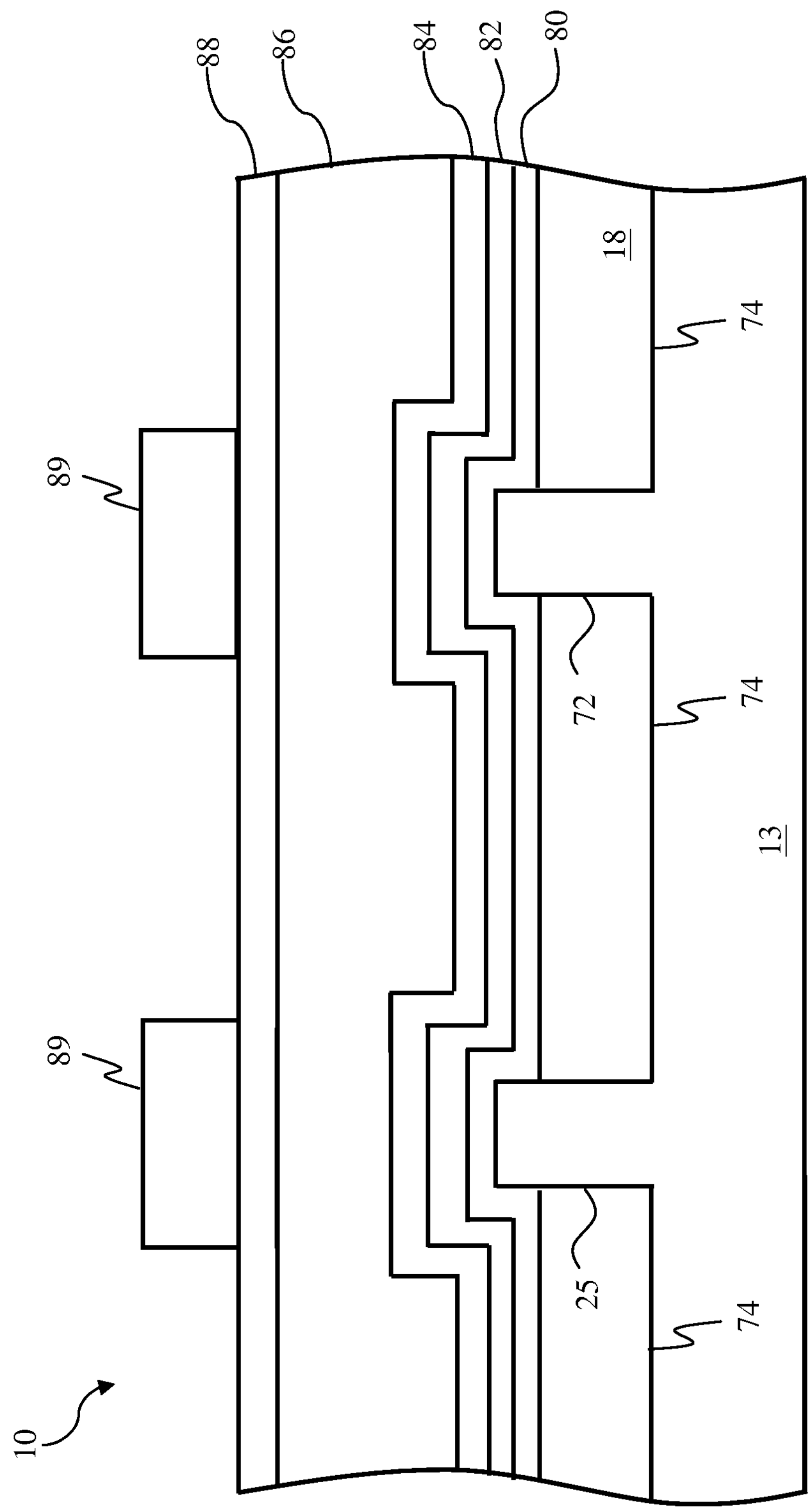
FIGS. 5-12 are diagrammatic fragmentary sectional views similar to FIG. 4 but showing the semiconductor device during various successive stages of manufacture.

Referring to FIG. 5, the silicon semiconductor substrate 13 is provided. The substrate protrusion 25 and a substrate protrusion 72 are formed from the substrate 13 using suitable processes including photolithography and etch processes. The photolithography processes include forming a photoresist layer (resist) overlying the substrate 13, exposing the resist to a pattern, performing post-exposure bake processes, and developing the resist to form a masking element including the resist. The masking element is then used to etch recesses 74 into the substrate 13, leaving the substrate protrusions 25 and 72. The recesses forming substrate protrusions 25 and 72 may be etched using reactive ion etch (RIE) and/or other suitable processes. Alternatively, the protrusions may be formed by double-patterning lithography (DPL) process. DPL allows for enhanced feature (e.g., fin) density. Various DPL methodologies may be used, including double exposure (e.g., using two mask sets), forming spacers adjacent features and removing the features to provide a pattern of spacers, resist freezing, and/or other suitable processes. After the substrate protrusions 25 and 72 are formed, silicon dioxide or other suitable dielectric is deposited and etched to form the shallow trench isolation (STI) regions 18 that surround and isolate the substrate protrusions. This may be accomplished by any suitable process, which may include dry etching, wet etching, and a chemical vapor deposition process.

Next, a dielectric layer 80 with a thickness in the range of about 1 to 200 Å is formed over the substrate protrusions 25 and 72 and the STI regions 18. The dielectric layer 80 is composed of a high-k dielectric material, HfOx, and is deposited using chemical vapor deposition (CVD). The high-k material of dielectric layer 80 is deposited on all portions of the protrusions 25 and 72 above the STI regions 18, including the top and side portions. Next, a barrier layer 82 of TiN is deposited by CVD over the dielectric layer 80 to a thickness in a range of about 5 to 1000 Å. A polysilicon layer 84 is then formed by CVD over the barrier layer 82. The polysilicon is deposited to a thickness in a range of about 50 to 200 Å. Next, a silicon germanium (SiGe) layer 86 with a thickness in the range of about 300 to 450 Å is formed over the polysilicon layer 84 using CVD. Finally, a second polysilicon layer 88 is deposited to a thickness of about 100 Å over the SiGe layer 86 using CVD. The layers 80, 82, 84, 86, and 88 may each alternatively be formed using any other suitable process, such as physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. Also, a photoresist layer 89 is deposited over the layer 88 and patterned in a known manner to leave portions 89 that facilitate removal of portions of the layer stack in subsequent steps.

Figure 6:
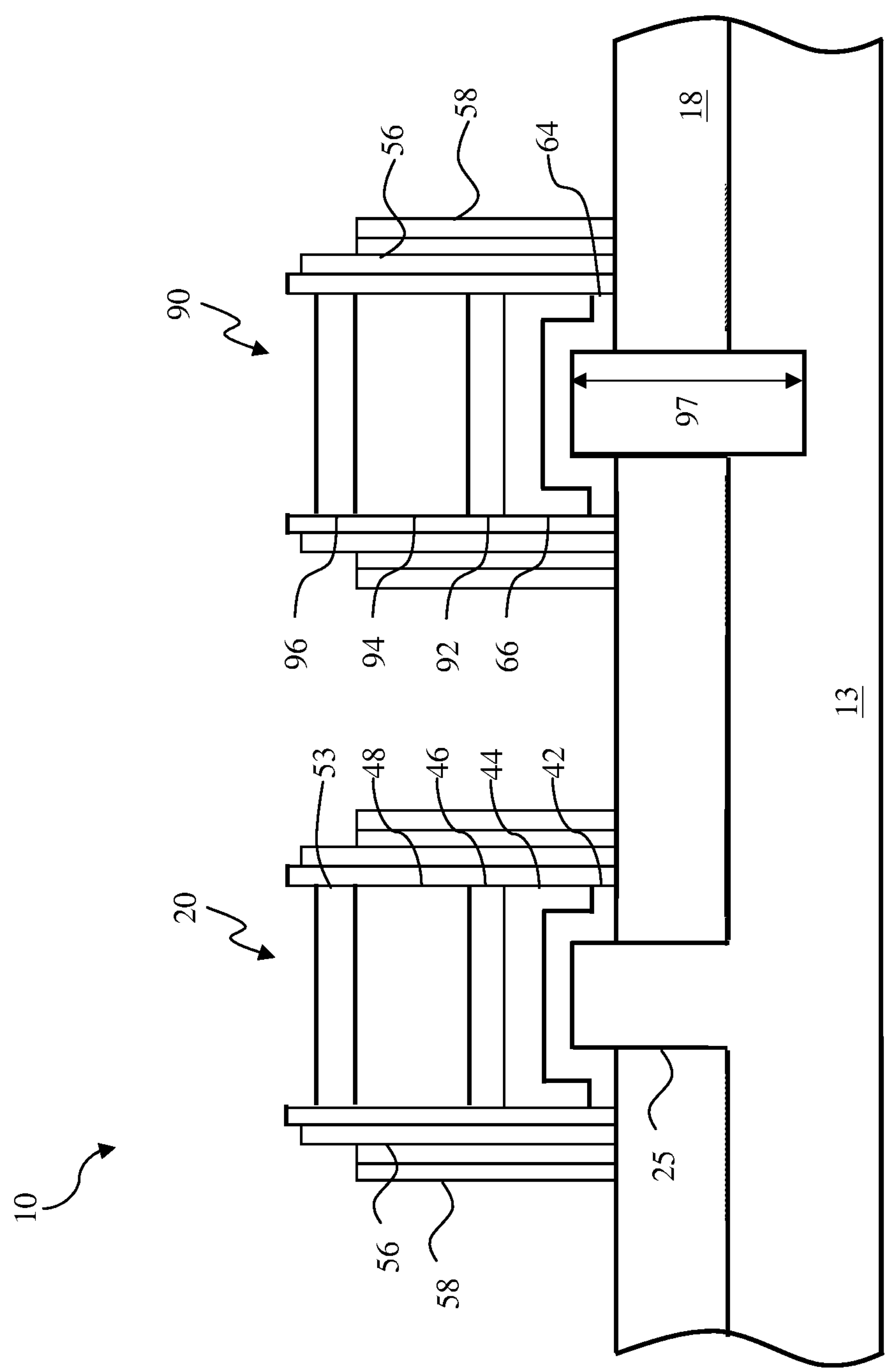

Referring now to FIG. 6, photolithography patterning processes are employed to form the gate structure 20 and a temporary gate structure 90, by removing the portions of the layers 80, 82, 84, 86, and 88 that are not protected by the photoresist portions 89 (FIG. 5). After patterning, the dielectric layer 42 (a portion of layer 80), the barrier layer 44 (a portion of layer 82), the polysilicon layer 46 (a portion of layer 84), the strain-inducing layer 48 (a portion of layer 86), and the polysilicon layer 53 (a portion of layer 88) remain over substrate protrusion 25, and form gate structure 20. And the dielectric layer 64 (a portion of layer 80), the barrier layer 66 (a portion of layer 82), a dummy polysilicon layer 92 (a portion of layer 84), a dummy SiGe layer 94 (a portion of layer 86), and a second dummy polysilicon layer 96 (a portion of layer 88) remain over the substrate protrusion 72, and form temporary gate structure 90. The photolithography patterning process used to form the gate structures may include any number of suitable steps, such as photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing. The etching processes include dry etching, wet etching, and/or other etching methods. It is understood that the above example does not limit the processing techniques that may be utilized to form the layers discussed above.

After patterning the layers over the substrate protrusions 25 and 72, known processes are employed to form the sealing spacers 56 and dummy spacers 58 along the sides of the gate structure 20 and the temporary gate structure 90. After deposition and etching, the sealing spacers 56 protect the four approximately vertical sides of each gate structure 20 and 22. Next, a process is performed to etch two recesses 97 (FIGS. 3 and 6) into substrate protrusion 72 (FIG. 5), one recess on each side of temporary gate structure 90. As part of the process, a protection layer (not shown) is first formed to protect the substrate protrusion 25. Then, dry etching is used to etch away the exposed portions of substrate protrusion 72. The recesses 97 may also be formed by wet etching or some other suitable process. A cleaning process may optionally be performed after etching to clean the recesses 97 with hydrogen fluoride (HF) or other suitable solution.

Figure 7:
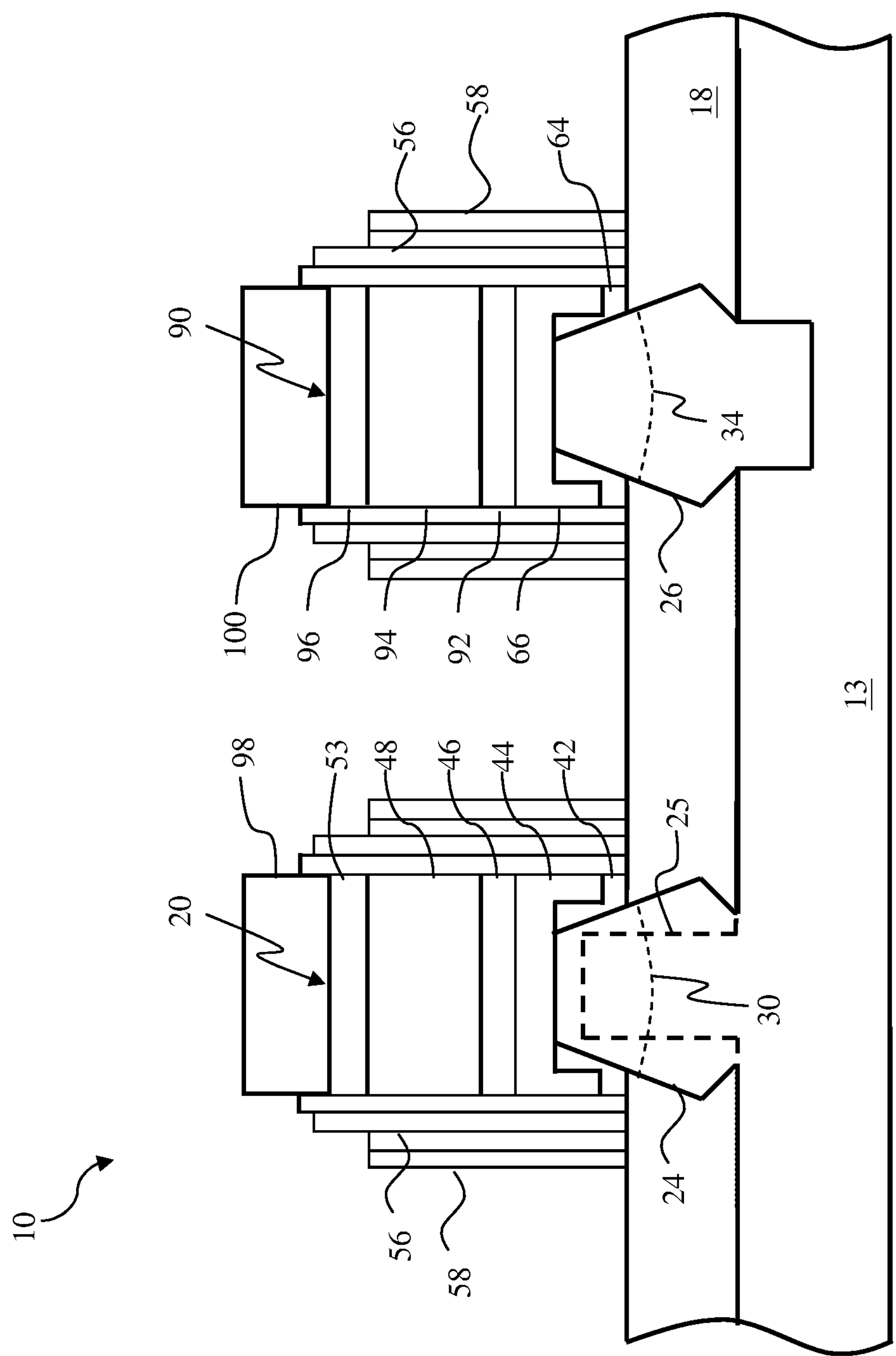

Referring now to FIG. 7, the source and drain regions 30, 32, 34, and 36 of the NMOS FinFET 11 and PMOS FinFET 12 are formed, of which two are visible in FIG. 7. First, epitaxial silicon growths 24 are grown on substrate protrusion 25 on opposite sides of the gate structure 20. The epitaxial growth processes include CVD deposition techniques (e.g., vapor-phase epitaxy (VPE) and/or ultra-high vacuum CVD (UHV-CVD)), molecular beam epitaxy, and/or other suitable processes. The epitaxial process may further use gaseous and/or liquid precursors, which interact with the composition of the substrate protrusion 25 (e.g., silicon). The channel region 38 (FIG. 2) is disposed between epitaxial growths 24 and, as the epitaxial Si is grown, tensile strain is induced in the channel region due to lattice mismatch. Alternatively, epitaxial silicon carbon (Si:C) may be grown instead of epitaxial silicon. The protrusion 25 and newly-formed epitaxial silicon growths 24 are then doped with n-type dopants, such as phosphorous or arsenic, to form the source and drain regions 30 and 32 of NMOS FinFET 11. Next, epitaxial growth processes are employed to form epitaxial silicon germanium growths 26 in the recesses 97 in substrate protrusion 72. The channel region 59 (FIG. 3) is disposed between the recesses 97 and, as the epitaxial SiGe is grown in the recesses 97, compression strain is induced in the channel region due to lattice mismatch. The epitaxial SiGe growths 26 are then doped with p-type dopants, such as boron, to form source and drain regions 34 and 36 of PMOS FinFET 12. Optionally, other source and drain regions, such as lightly doped drain (LDD) and/or highly doped drain (HDD) regions, may be formed in the fin structures prior to forming the source and drain regions 30, 32, 34, and 36. Additionally, during this stage of processing, hard mask layers 98 and 100 are formed on top of the gate structure 20 and the temporary gate structure 90, respectively. The hard mask layers 98 and 100 are silicon nitride in the present embodiment but alternatively may be silicon oxynitride, silicon carbide, or other suitable material.

Figure 8:
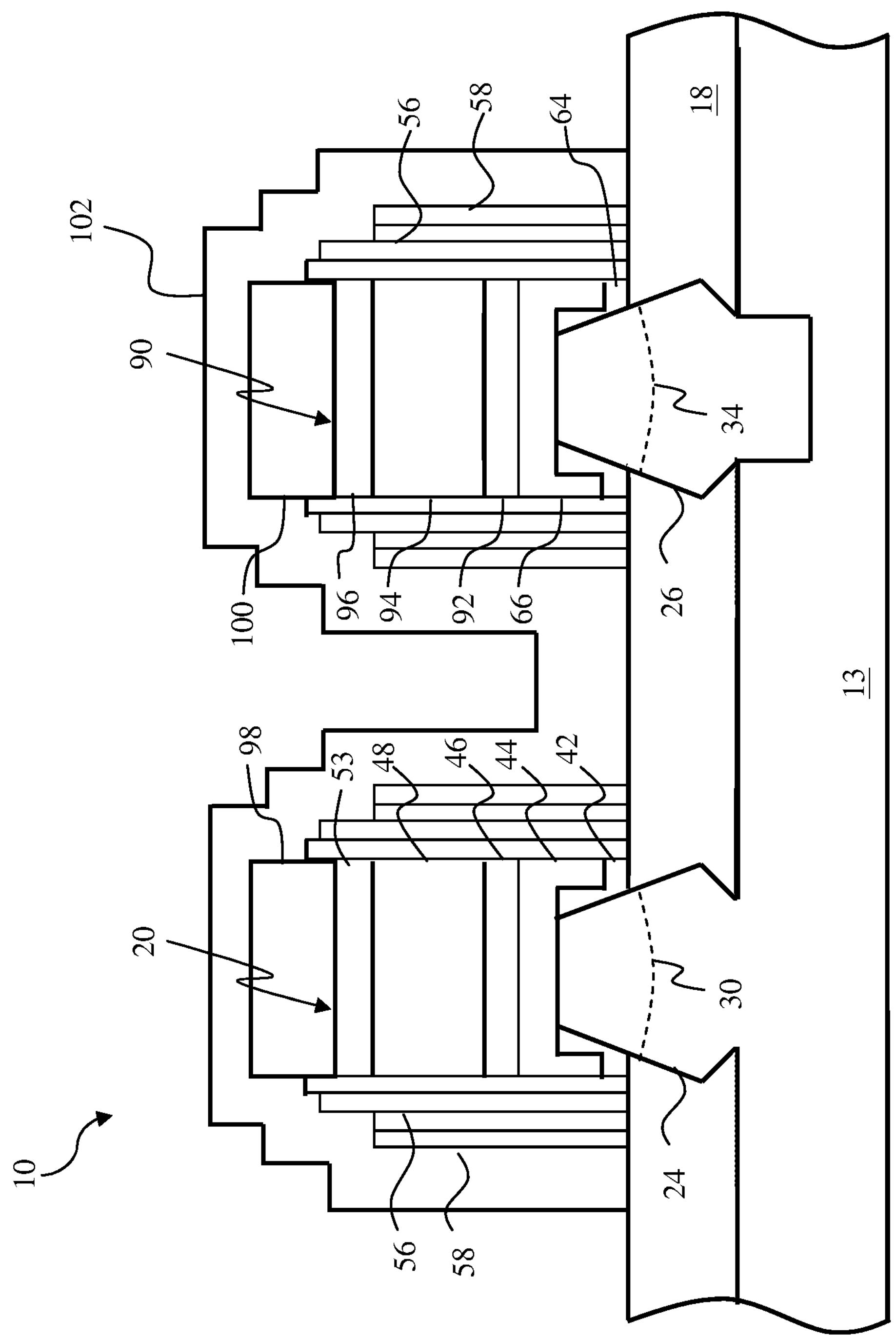

Referring now to FIG. 8, semiconductor device 10 is subjected to processing to enhance the tensile strain in the channel region 38 of the NMOS FinFET 11. Specifically, stress memorization techniques (SMT) are performed. First, a temporary capping layer 102 composed of silicon oxide and silicon nitride is deposited over the entire semiconductor device 10, including the gate structures 20 and 90. A thickness of the silicon oxide is in a range of about 50 Å to about 100 Å. A thickness of the silicon nitride is in a range of about 50 Å to about 250 Å. Next, semiconductor device 10 is subjected to a rapid thermal anneal (RTA) and a millisecond anneal (MSA). The RTA is performed at a peak temperature of about 990 to 1010° C., at a pressure of about 760 torr, and for a duration in a range of about 1 to 4 seconds. The MSA is performed at a peak temperature of about 1250° C., at a pressure of about 760 ton, and for a duration in a range of about 0.4 to 0.8 milliseconds. The SMT process creates tensile strain in the channel region 38 by "freezing" the temperature-related stress condition of the gate structure 20 created during the RTA and MSA. Namely, the larger coefficient of thermal expansion of the strain-inducing SiGe layer 48 forces the crystal lattice of the polysilicon layer 46 below it to abnormally expand during the RTA and MSA. Then, during recrystallization of the polysilicon crystal lattice after the high-temperature anneals, the polysilicon layer 46 retains or "memorizes" the tensile strain condition induced during the anneals. This tensile strain is propagated down through the gate structure 20 and into the channel region 38. After the SMT process, the temporary capping layer 102 is removed and processing continues.

Figure 9:
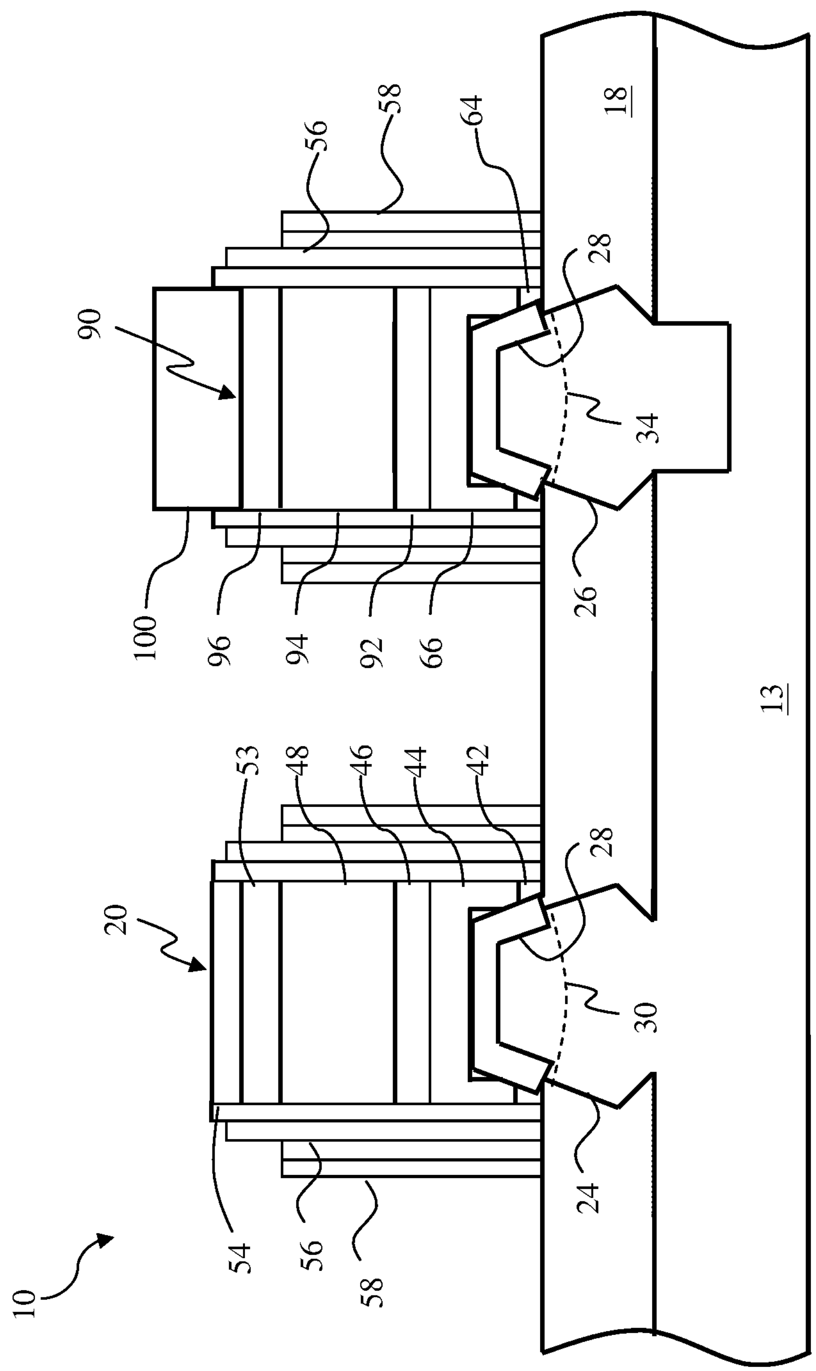

With reference now to FIG. 9, a silicidation process is performed on semiconductor device 10. First, the hard mask layer 98 is removed from the gate structure 20 to expose the polysilicon layer 53, while leaving hard mask layer 100 in place. Next, a silicidation process such as a self-aligned silicide (salicide) process is performed to grow a silicide layer on any exposed silicon-based surface. Specifically, a metal material such as nickel is deposited over FinFETs 11 and 12, the temperature is raised to cause a reaction between the nickel and any silicon exposed to the nickel, and then the un-reacted nickel is etched away. During silicidation, nickel silicide layers 28 are formed on the epitaxial Si growths 24 and epitaxial SiGe growths 26, and silicide layer 54 is formed over the polysilicon layer 53 in the gate structure 20. Hard mask layer 100 remains on temporary gate structure 90 during silicidation to prevent the formation of silicide on dummy polysilicon layer 96, but is removed after silicidation. After the silicide formation on the epitaxial growths, the fin structures (or projections) 14 and 16 are complete.

Figure 10:
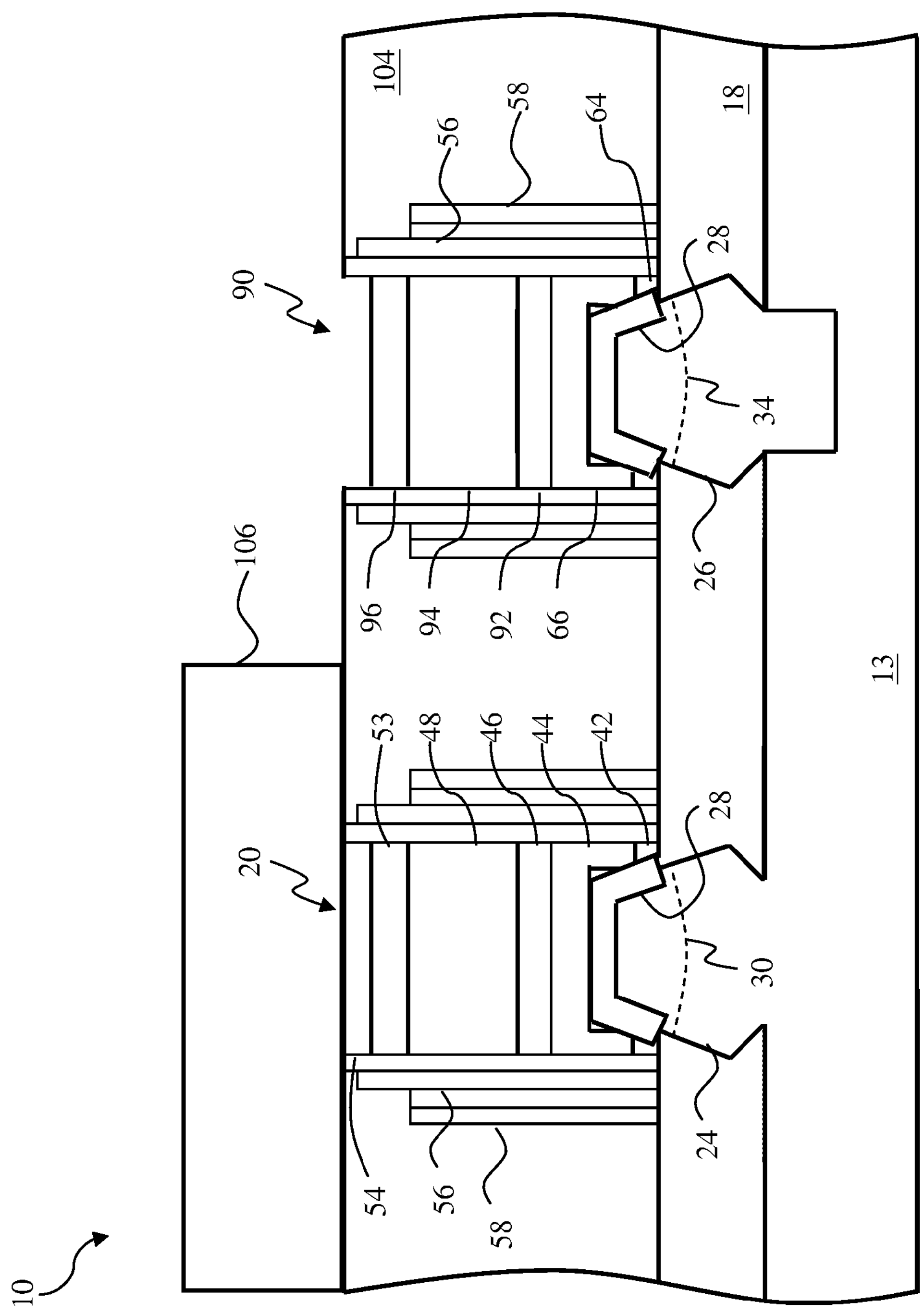

Referring now to FIG. 10, an interlayer (or inter-level) dielectric (ILD) layer 104 is next formed over the semiconductor device 10, including gate structures 20 and 90 and fin structures (or projections) 14 and 16. The ILD layer 104 is composed of a dielectric such as silicon oxide. Subsequent to the deposition of the ILD layer 104, a chemical mechanical polishing (CMP) process is performed, until a top portion of each gate structure 20 and 90 is exposed. Next, a patterned photoresist layer 106 is deposited over a portion of the semiconductor device 10 to protect the gate structure 20.

Figure 11:
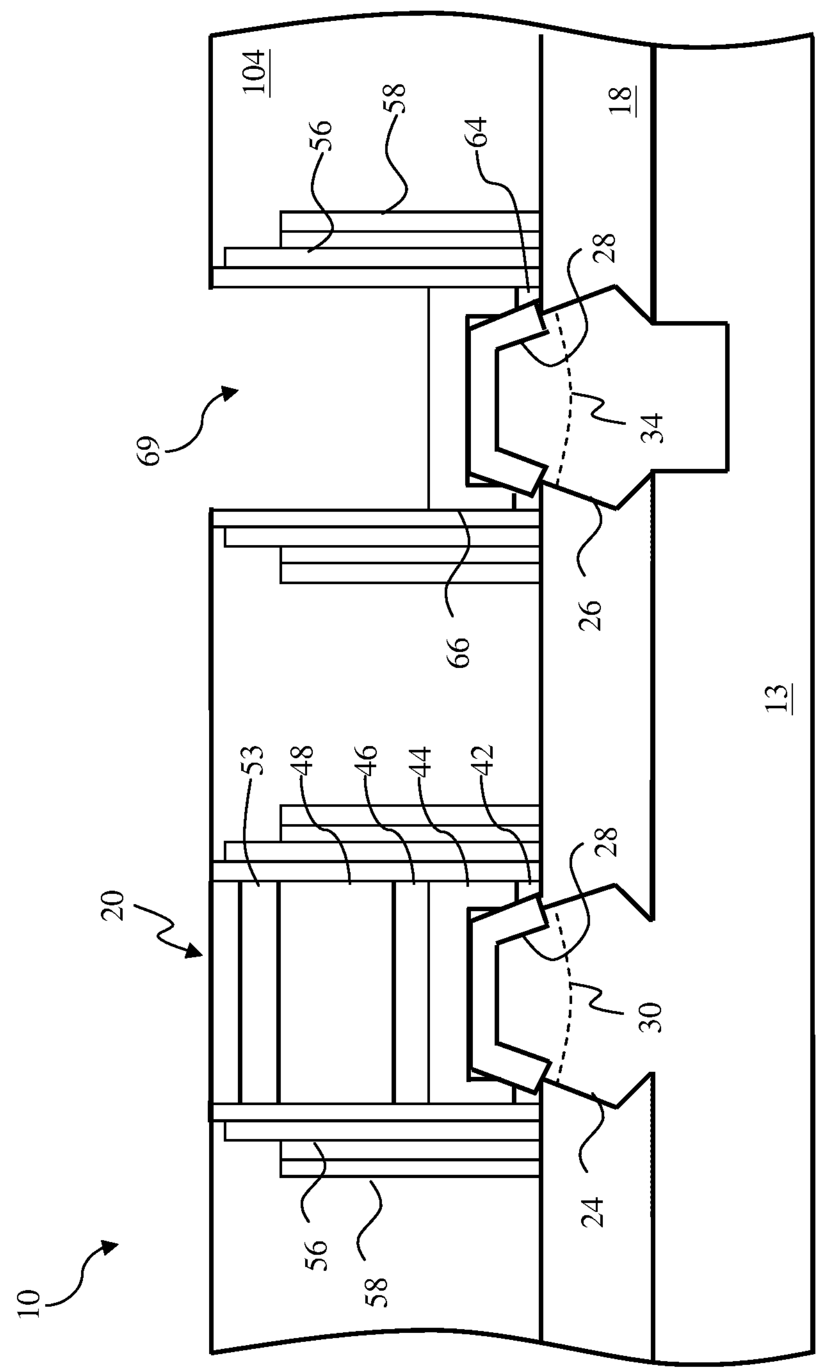
Figure 12:
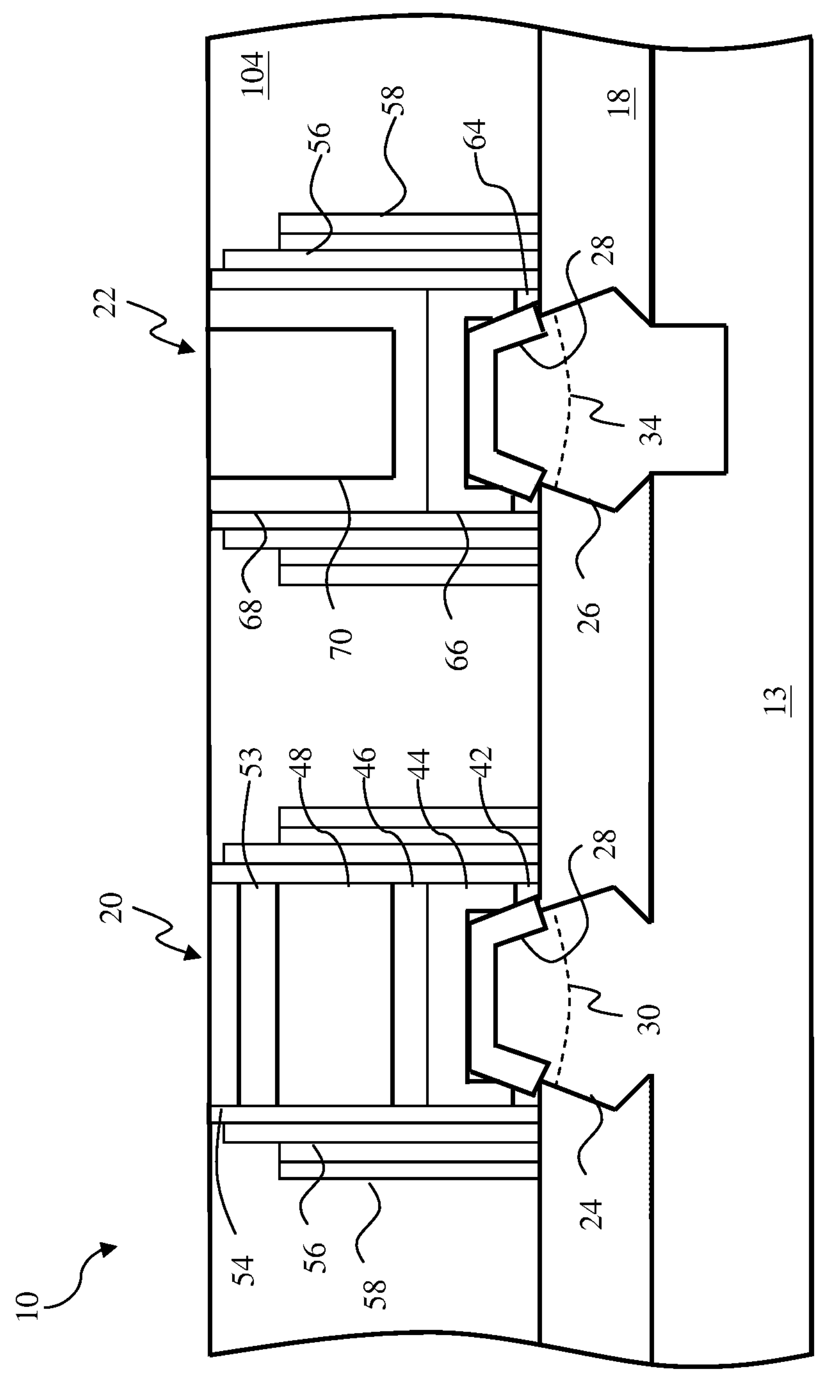

Referring now to FIGS. 11 and 12, a gate replacement process is performed, wherein the top three layers of the temporary gate structure 90 are removed and replaced with a metal gate electrode. In particular, FIG. 11 illustrates the temporary gate structure 90 after removal of the dummy polysilicon layers 92 and 96 and the dummy SiGe layer 94. The photoresist layer 106 protects the gate structure 20 during this removal of the dummy layers. The dummy layers may be removed from the temporary gate structure 90 simultaneously or independently by any suitable process, such as a dry etching and/or wet etching process. After etching away the layers 92, 94, and 96, the top surface of barrier layer 66 and the inner surfaces of sealing spacers 56 respectively define bottom and side surfaces of the opening 69. Next, as shown in FIG. 12, photoresist layer 106 is removed and the opening 69 is filled with a metal gate electrode that includes work function layer 68 and metal fill layer 70, to thereby form the final gate structure 22. Specifically, filling the opening 69 includes then depositing the work function layer 68 over the barrier layer 42 and on the sides of the sealing spacers 56 and depositing the metal fill layer 70 in the remainder of the opening 69. In the present embodiment, the work function layer 68 is formed by the deposition of p-type work function metal (P-metal) such as TiN to a thickness in a range of about 10 Å to 200 Å. And the metal fill layer 70 is formed by the deposition of aluminum or other conductive metal such as copper, tungsten, or titanium. Alternatively, the opening 69 may be filled with only the metal fill layer 70, and the gate structure 22 may be tuned to have an appropriate work function value in other known ways. Subsequent to the formation of the gate structure 22, a CMP process is performed to planarize the top portions of the gate structures 20 and 22 and the ILD layer 104.

It is understood that the semiconductor device 10 will undergo further processing to complete fabrication. For example, a not-illustrated multilayer interconnection (MLI) including metal layers (e.g., M1, M2, etc.) and inter-metal dielectric (IMD) will be formed above fin and gate structures 14, 16, 20, and 22 in order to electrically couple various device parts to form an integrated circuit. The multilayer interconnection includes vertical interconnects, such as conventional vias or contacts, and horizontal interconnects, such as metal lines. The various interconnection features may utilize various conductive materials including copper, tungsten and silicide. In one example, a damascene process is used to form copper multilayer interconnection structure.

Figure 13:
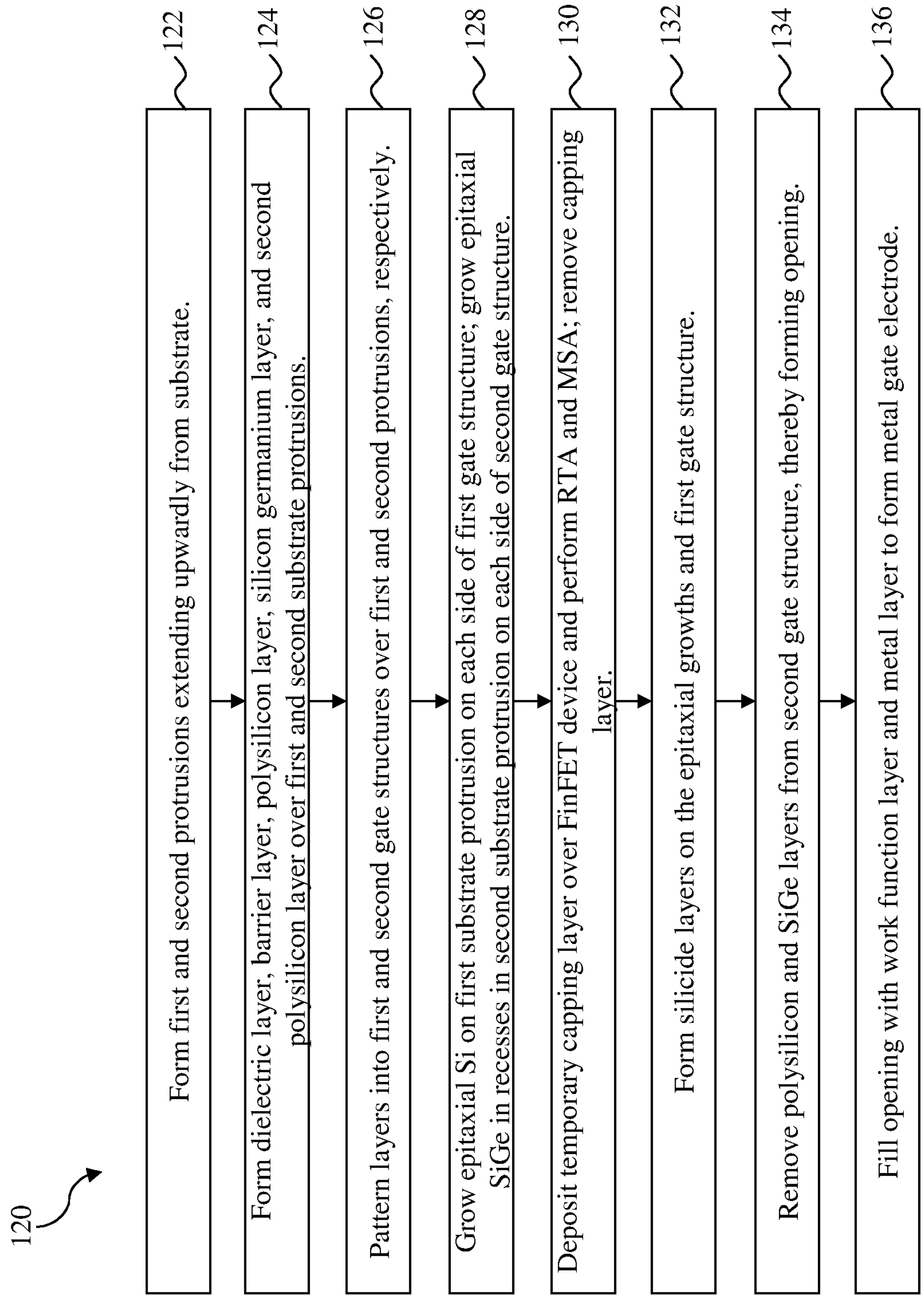
FIG. 13 is a high-level flowchart showing a process that is described in association with FIGS. 5-12.

FIG. 13 is a high-level flowchart showing the process 120 that was described above in association with FIGS. 5-12. Process 120 begins at block 122 where the substrate protrusions 25 and 72 are formed from the substrate 13. The STI regions 18 are also formed after the protrusions are formed. The process 120 proceeds to block 124 where the dielectric layer 80, the barrier layer 82, the polysilicon layer 84, the silicon germanium layer, 86 and the second polysilicon layer 88 are formed over the substrate protrusions 25 and 72. Then, in block 126, the layers formed in block 124 are patterned into the gate structure 20 and the temporary gate structure 90. The gate structure 20 overlays the channel region 38 of the fin structure (or projection) 14 and the temporary gate structure 90 overlays the channel region 59 of the fin structure (or projection) 16. Process 120 proceeds to block 128 where the epitaxial Si growths 24 are grown on the substrate protrusion 25 on each side of the gate structure 20. And the epitaxial SiGe growths 26 are grown on the substrate protrusion 72 on each side of the gate structure 90. Additionally, the epitaxial Si growths 24 and substrate protrusion 25 are doped with n-type dopants to form the source and drain regions 30 and 32. And the epitaxial SiGe growths 26 are doped with p-type dopants to form the source and drain regions 34 and 36. Also, hard mask layers 98 and 100 are formed on the top of gate structures 20 and 90. Then, in block 130, the temporary capping layer 102 is deposited over the semiconductor device 10. Subsequently, a RTA and MSA are performed to induce tensile channel strain in the channel region 38, and the capping layer is removed. Next, in block 132, the silicide layer 54 is formed over the gate structure 20 and the silicide layers 28 are formed on the epitaxial growths. A gate replacement process is then performed over the course of blocks 134 and 136. Specifically, in block 134, the dummy polysilicon layers 92 and 96 and the dummy SiGe layer 94 are removed from the temporary gate structure 90, which creates the opening 69 above the barrier layer 66. Next, in block 136, the opening 69 is filled with the work function layer 68 and metal fill layer 70 to form the final gate structure 22.

The semiconductor device 10 is not limited to the aspects and structure of the integrated circuit described above. For example, a single integral gate structure might overlay both of the fin structures (or projections) 14 and 16 and serve as the gate structure of both the NMOS FinFET 11 and the PMOS FinFET 12. In such a case, during the gate replacement process described in association with FIGS. 11 and 12, the portion of the integral gate structure overlaying fin structure (or projection) 14 would be protected while the portion overlaying fin structure (or projection) 16 would be replaced with a metal gate electrode. Further, the integrated circuit in the semiconductor device 10 can also include passive components such as resistors, capacitors, inductors, and/or fuses; and active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a substrate having a first strained channel region and a second strained channel region therein, the second channel region being strained in a different manner than the first channel region;

a first gate structure including:

a dielectric layer disposed at least partly over the first channel region, the dielectric layer including an interfacial layer physically in contact with the first channel region;

a barrier layer disposed at least partly over the first channel region and physically in contact with the dielectric layer;

a first conductive layer disposed over the barrier layer, and having a characteristic with a first value;

a strain-inducing conductive layer disposed over the first conductive layer, and having the characteristic with a second value, wherein the second value is different from the first value; and a second conductive layer disposed over the strain-inducing conductive layer, and having the characteristic with the first value; and a second gate structure including:

a high-k dielectric layer disposed at least partly over the second channel region;

a U-shaped work function metal layer disposed over the high-k dielectric layer, the U-shaped work function metal layer forming an opening having opposing surfaces therein; and a metal fill layer disposed at least partially within the opening such that the metal fill layer is in physical contact with the opposing surfaces.

2. The device according to claim 1, wherein the characteristic is one of a thermal expansion coefficient and a crystal lattice constant.

3. The device according to claim 2, wherein the characteristic is the crystal lattice constant; and wherein the first and second conductive layers both have a first thermal expansion coefficient and the strain-inducing conductive layer has a second thermal expansion coefficient different from the first thermal expansion coefficient.

4. The device according to claim 3, wherein the first and second conductive layers are doped polysilicon and the strain-inducing conductive layer is silicon germanium (SiGe).

5. The device according to claim 1, wherein the substrate includes first and second upwardly-extending projections, the first channel region being at least partly in the first projection and the second channel region being at least partly in the second projection;

wherein the first gate structure engages the first projection adjacent to the first channel region; and wherein the second gate structure engages the second projection adjacent to the second channel region.

6. The device according to claim 5, wherein the first and second conductive layers are doped polysilicon and the strain-inducing conductive layer is silicon germanium (SiGe).

7. The device according to claim 6, wherein the strain-inducing conductive layer has a thickness in a range of approximately 300 to 450 angstroms and the first and second conductive layers each have a thickness in a range of approximately 50 to 200 angstroms.

8. The device according to claim 1, wherein the strain in the first channel region is tensile strain and the strain in the second channel region is compression strain.

9. A device comprising:

a substrate;

first and second projections extending upwardly from the substrate, the first projection having a tensile-strained first channel region therein and the second projection having a compression-strained second channel region therein; and first and second gate structures engaging the first and second projections adjacent to the first and second channel regions, respectively;

wherein the first gate structure includes:

a dielectric layer adjacent the first channel region;

a first conductive layer disposed over the dielectric layer;

a strain-inducing conductive layer disposed over the first conductive layer; and a second conductive layer disposed over the strain-inducing conductive layer; and wherein the second gate structure includes:

a high-k dielectric layer adjacent the second channel region; and a metal layer disposed over the high-k dielectric layer.

10. The device according to claim 9, wherein the first and second conductive layers are doped polysilicon and each have a first thermal expansion coefficient and a first crystal lattice constant; and wherein the strain-inducing conductive layer has a second thermal expansion coefficient different from the first thermal expansion coefficient, and a second crystal lattice constant different from the first crystal lattice constant.

11. The device according to claim 10, wherein the strain-inducing conductive layer is silicon germanium (SiGe).

12. The device according to claim 11, wherein the strain-inducing conductive layer has a thickness in a range of approximately 300 to 450 angstroms and the first and second conductive layers each have a thickness in a range of approximately 50 to 200 angstroms.

13. The device according to claim 9, including:

first epitaxial growths on portions of the first projection at each side of the first gate structure, the first epitaxial growths imparting tensile strain to the first channel region; and second epitaxial growths on portions of the second projection at each side of the second gate structure, the second epitaxial growths imparting compressive strain to the second channel region.

14. The device according to claim 13, wherein the first epitaxial growths are epitaxial silicon and the second epitaxial growths are epitaxial silicon germanium (SiGe).

15. The device according to claim 9, wherein the second gate structure includes a work function layer disposed between the high-k dielectric layer and the metal layer.

16. A device comprising:

a substrate;

a first fin-like field effect transistor (FinFET) disposed on the substrate, the first FinFET including:

a first strained channel region;

a first dielectric layer disposed at least partly over the first strained channel region, the first dielectric layer including an interfacial layer physically in contact with the first strained channel region;

a barrier layer disposed at least partly over the first strained channel region and physically in contact with the first dielectric layer;

a first polysilicon layer disposed at least partly over the first strained channel region and physically in contact with the barrier layer;

a strain-inducing layer disposed at least above the first strained channel region and imparting at least a portion of the strain in the first strained channel region; and a second polysilicon layer disposed at least partly over the first strained channel region and physically in contact with the strain-inducing layer; and a second FinFET disposed on the substrate, the second FinFET including:

a second strained channel region, the second strained channel region being strained in a different manner than the first strained channel region;

a high-k second dielectric layer disposed at least above the second strained channel region;

a U-shaped work function metal layer disposed over the high-k second dielectric layer, the U-shaped work function metal layer forming an opening having opposing surfaces therein; and a metal fill layer disposed at least partially within the opening such that the metal fill layer is in physical contact with the opposing surfaces.

17. The device according to claim 16, wherein the first FinFET further includes first epitaxial growths disposed on either side of the first strained channel region, the first epitaxial growths imparting a further portion of the strain in the first strained channel region.

18. The device according to claim 17, wherein the second FinFET includes second epitaxial growths disposed on either side of the second strained channel region, the second epitaxial growths being of a different material than the first epitaxial growths and imparting the strain in the second strained channel region.

19. The device according to claim 16, wherein the strain in the first strained channel region is tensile strain and the strain in the second strained channel region is compression strain.

* * * * *